United States Patent [19]

Chengson et al.

[11] Patent Number: 4,728,818

[45] Date of Patent: Mar. 1, 1988

[54] EMITTER FUNCTION LOGIC WITH CONCURRENT, COMPLEMENTARY OUTPUTS

[75] Inventors: David P. Chengson, Mountain View; Aurangzeb K. Khan, San Bruno, both of Calif.

[73] Assignee: Tandem Computers Incorporated, Cupertino, Calif.

[21] Appl. No.: 942,669

[22] Filed: Dec. 17, 1986

[51] Int. Cl.[4] .................. H03K 3/284; H03K 3/29; H03K 19/086

[52] U.S. Cl. ...................... 307/272.2; 307/289; 307/290; 307/291; 307/455; 307/466; 307/467

[58] Field of Search .............. 307/455, 466, 467, 289, 307/290, 291, 272.2

[56] References Cited

U.S. PATENT DOCUMENTS

| | | | |
|---|---|---|---|
| 3,795,822 | 3/1974 | Skokan | 307/455 |
| 4,145,623 | 3/1979 | Doucette | 307/289 |
| 4,357,547 | 11/1982 | Espe et al. | 307/289 |
| 4,378,505 | 3/1983 | Scavuzzo | 307/289 |

Primary Examiner—Stanley D. Miller
Assistant Examiner—Trong Quang Phan
Attorney, Agent, or Firm—Townsend and Townsend

[57] ABSTRACT

An improved EFL gate which provides concurrent true and complementary outputs. An input transistor has its base coupled to an input and its emitter coupled to an emitter of a reference transistor. The reference transistor has its base coupled to a voltage reference and its collector coupled to the base of a true output transistor. The emitter of the true output transistor provides the true output, while its collector is coupled to a voltage supply. A complementary output transistor has its base coupled to the collector of the input transistor with its emitter providing the complementary output. Its collector is coupled to the voltage supply, as is the collector of the input transistor.

4 Claims, 3 Drawing Figures

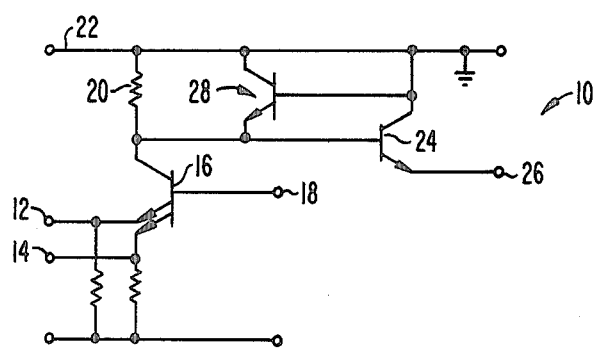
FIG._1. PRIOR ART
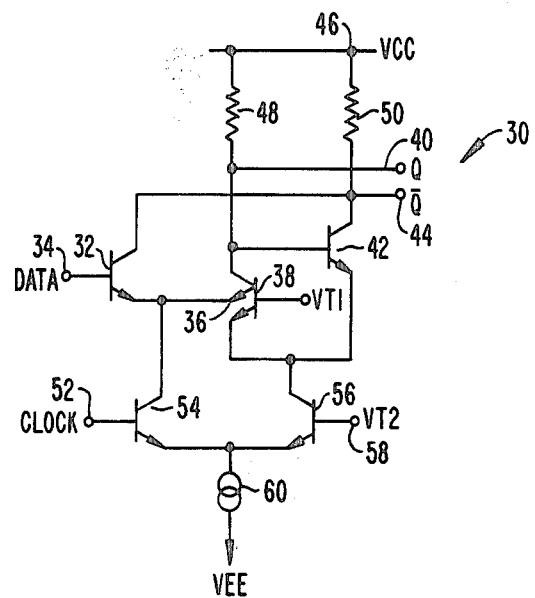
FIG._2. PRIOR ART

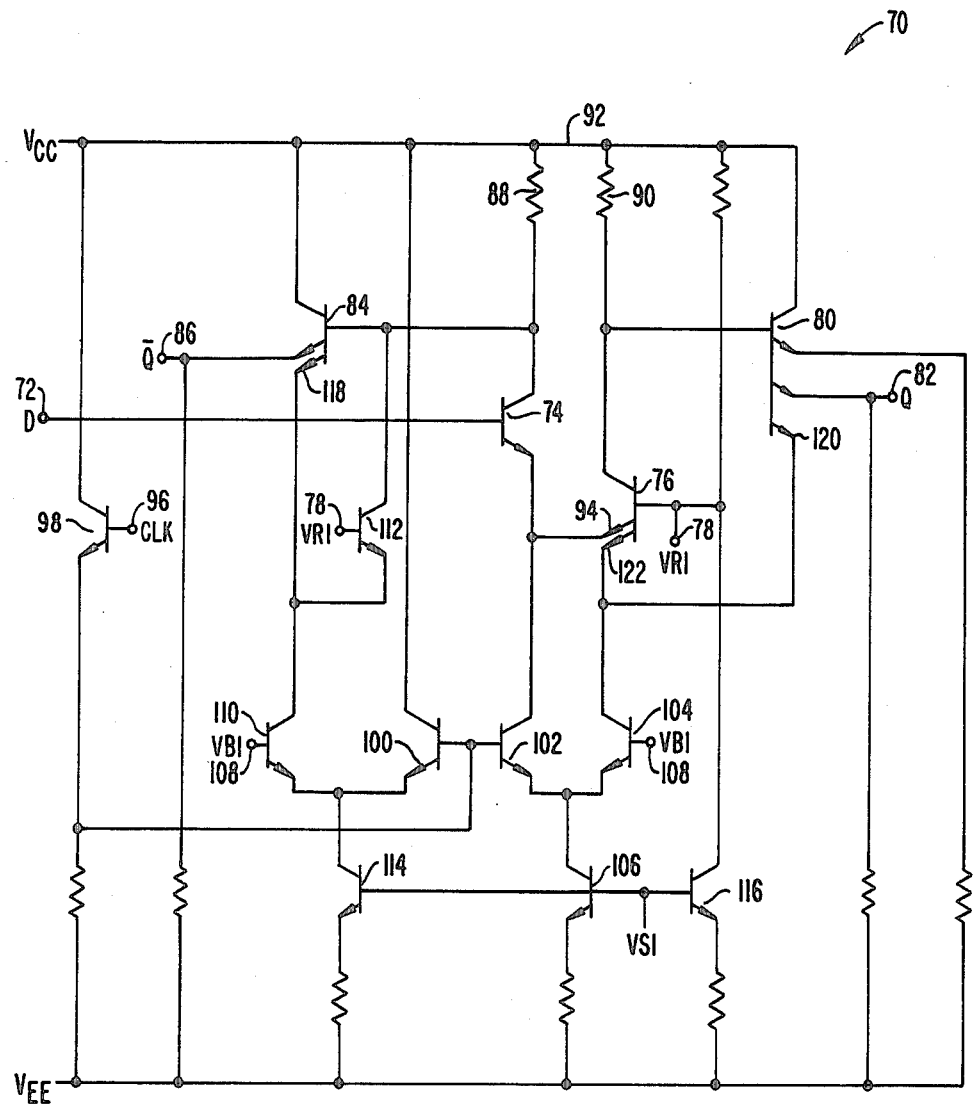
FIG._3.

EMITTER FUNCTION LOGIC WITH CONCURRENT, COMPLEMENTARY OUTPUTS

BACKGROUND

The present invention relates to emitter function logic gates and, in particular, to such gates having complementary outputs.

Emitter function logic is a class of logic circuit developed for use in large scale integration (LSI) fabrication. Emitter function logic uses less area than other logic circuits by providing only a true output, and not a complementary output. Thus, the requirement of complementing a signal twice to provide a true output as in other logic families is avoided. Therefore, emitter function logic (EFL) is limited to gates which do not require both a true and complementary output. However, by reducing the Miller effect (the multiplication of collector-base feedback capacitance by the voltage gain) and replacing a passive emitter-follower with an active emitter-follower, EFL enjoys an improved speed-power product over ECL (emitter-coupled logic). Modifications of EFL gates to provide complementary outputs have been created, but there is a time delay between the appearance at the output of the true output and the complementary output, thereby limiting the applications.

FIG. 1 shows a basic EFL AND gate 10 as disclosed in U.S. Pat. No. 3,795,822 to Skokan. AND gate 10 has first and second inputs 12 and 14, respectively. Inputs 12 and 14 are coupled to the first and second emitters of an input transistor 16. The base of transistor 16 is coupled to a reference voltage 18 and its collector is coupled through a resistor 20 to a supply voltage 22. The collector of transistor 16 is also coupled to the base of an output transistor 24. The collector of output transistor 24 is also coupled to supply voltage 22. Transistor 24 has an emitter coupled to an output 26 which provides the output of the AND gate. Output 26 is a true output, and no complementary output is provided. Resistor 20 provides biasing and a transistor 28 prevents saturation of output transistor 24.

A modified EFL circuit with latched true and complementary outputs is shown in FIG. 2 as disclosed in U.S. Pat. No. 4,145,623 to Doucette. Latch 30 of FIG. 2 uses an input transistor 32 which has its base coupled to a data input 34. Its emitter is coupled to a first emitter 36 of a transistor 38, which is similar to transistor 16 of FIG. 1. Transistor 38 has a collector which provides a true output 40 and is also coupled to the base of an output transistor 42. The collector of output transistor 42 is coupled to the collector of input transistor 32 and provides a complementary output 44. The collectors of transistors 38 and 42 are coupled to a supply voltage 46 through resistors 48 and 50 respectively. A clock input 52 is provided to the base of a transistor 54 which is coupled at its emitter to another transistor 56. The base of transistor 56 is coupled to a voltage reference 58. The coupled emitters of transistors 54 and 56 are coupled to a current source 60. The clock serves to latch the outputs on true and complementary outputs 40 and 44, respectively.

Although gate 30 provides both true and complementary outputs, it can be seen from an examination of the circuit that signals will appear at these outputs at different periods of time after an input is applied to data input 34. The true signal on output 40 will not change state until the input signal propagates through transistor 32 and transistor 38. The propagation time through transistor 38 is the turn-on time of the transistor. The turn-on time is small because it is a minimum geometry device, the capacitive effects are relatively small and its base is at a constant reference D.C. voltage. The complementary output 44 will not change state, however, until the signal additionally propagates through transistor 42. Thus, the time at which outputs appear on the true and complementary outputs varies by an amount equal to the propagation delay through one transistor stage.

In certain applications, it is desirable to have concurrent true and complementary outputs from an EFL gate without compromising the size and speed advantages of the EFL gate.

SUMMARY OF THE INVENTION

The present invention is an improved EFL gate which provides concurrent true and complementary outputs. An input transistor has its base coupled to an input and its emitter coupled to an emitter of a reference transistor. The reference transistor has its base coupled to a voltage reference and its collector coupled to the base of a true output transistor. The emitter of the true output transistor provides the true output, while its collector is coupled to a voltage supply. A complementary output transistor has its base coupled to the collector of the input transistor with its emitter providing the complementary output. Its collector is coupled to the voltage supply, as is the collector of the input transistor.

To provide a latched output, two emitter-coupled complementary pairs are used. The first emitter-coupled pair have their collectors coupled to the emitter of the input transistor and a second emitter of the reference transistor, respectively. The second emitter of the reference transistor is also coupled to a second emitter of the true output transistor. The coupled emitters are connected to a current source. The base of one transistor is coupled to a clock input while the base of the other transistor is coupled to a voltage reference. Similarly, the other emitter-coupled transistor pair have their bases and emitters so connected. The collector of one transistor is coupled to the voltage supply while the collector of the other transistor is coupled to a second emitter of the complementary output transistor. To provide the latching function, another transistor has its collector coupled to the base of the complementary output transistor, its emitter coupled to the second emitter of the complementary output transistor and its base coupled to the first voltage reference.

The present invention substantially retains the speed and size advantages of an EFL circuit while providing substantially concurrent complementary and true outputs. The present invention thus provides concurrent true and complementary outputs, which previously were only available in emitter coupled logic (ECL) circuits. The present invention requires more area than the prior art gate of FIG. 2, but less area than an ECL gate. Similarly, the power consumption is more than that of FIG. 2, but less than the power consumption of an ECL gate. The speed, defined as the time from the input changing state to the slowest output changing state, is faster for the present invention than the circuit of FIG. 2 or a standard ECL gate.

For a further understanding of the nature and advantages of the invention, reference should be made to the ensuing detailed description taken in conjunction with the accompanying drawings.

BRIEF DESCRIPTION OF THE DRAWINGS

FIG. 1 is a schematic diagram of a prior art EFL AND gate:

FIG. 2 is a schematic diagram of a prior art D-type latch having both true and complementary outputs; and FIG. 3 is a schematic diagram of a D-type latch having concurrent true and complementary outputs according to the present invention.

DETAILED DESCRIPTION OF THE PREFERRED EMBODIMENT

FIG. 3 shows a D-type latch 70 according to the present invention having concurrent true and complementary outputs. A D-input 72 is coupled to the base of an input transistor 74. Transistor 74 has an emitter coupled to an emitter of a reference transistor 76. Transistor 76 has its base coupled to a first voltage reference 78. The collector of transistor 76 is coupled to the base of a true output transistor 80 which has an emitter coupled to a true output 82. The collector of input transistor 74 is coupled to the base of a complementary output transistor 84. An emitter of transistor 84 is coupled to a complementary output 86. Biasing resistors 88 and 90 couple the collectors of transistors 74 and 76, respectively, to a Vcc voltage supply 92.

In operation, when input 72 goes high, transistor 74 is turned on, thereby pulling current through biasing resistor 88 and pulling down the base of transistor 84, thus providing a low level output to complementary output 86. For the true output, when transistor 74 is turned on, an emitter 94 of transistor 76 is forced to a high value, thereby limiting the current through the collector of transistor 76 from resistor 90. The base of transistor 80 is thus raised to Vcc less the voltage drop across resistor 90, thereby providing a high level output on true output 82. For a low level input to input 72, the true and complementary outputs will be reversed.

Additional circuitry is provided to give a clock signal which can latch the outputs. A clock input 96 is coupled to the base of a transistor 98. The emitter of transistor 98 is coupled to the bases of transistors 100 and 102. Transistor 102 has its emitter coupled to a transistor 104 and its collector coupled to the emitter of transistor 74. Transistor 104 has its collector coupled to a second emitter 122 of reference transistor 76 and a second emitter 120 of output transistor 80. The coupled emitters of transistors 102 and 104 are connected to a current source transistor 106. The base of transistor 104 is coupled to a second voltage reference level 108.

Similarly, transistor 100 has its emitter coupled to the emitter of a transistor 110. Transistor 110 has its base coupled to reference voltage 108 and its collector coupled to a second emitter 118 of complementary output transistor 84. The collector of transistor 100 is coupled to supply voltage 92. A transistor 112 is provided with a collector coupled to the base of complementary output transistor 84 and an emitter coupled to the collector of transistor 110. The base of transistor 112 is coupled to first reference voltage 78.

The circuit also includes current source transistors 114 and 116 and various biasing resistors not mentioned.

In operation, when the positive edge of a clock input is applied to clock input 96, the level of the emitter of transistor 98 is raised, thereby providing a high voltage level to the bases of transistors 100 and 102, turning them on. This enables input transistor 74 so that a subsequent input signal can propagate to the output. Simultaneously transistors 110 and 104 are turned off, thereby disabling the latching output and enabling a new output to be provided.

After the input has been provided to the appropriate outputs, the clock signal falling edge will latch these outputs. When the clock goes low, transistors 100 and 102 are turned off and transistors 104 and 110 are turned on. When the complementary output 86 is low, the turning on of transistor 110 allows current to flow through transistor 112. This current is pulled through biasing resistor 88 to keep the base of transistor 84 low and thus to keep complementary output 86 low. Conversely, if complementary output 86 were high when the clock has its falling edge, current is drawn through second emitter 118 of output transistor 84, but the base of transistor 84 is higher than voltage reference 78, thus keeping transistor 112 turned off. This results in the base of transistor 84 remaining at a high level since transistor 112 cannot bring it low and the current into the base of transistor 84 is small, and thus transistor 84 can't develop sufficient voltage across resistor 88 to bring the voltage level at the base of transistor 84 low. Transistor 112 and second emitter 118 of transistor 84 thus essentially act as a differential pair, with one or the other being turned on.

A similar result is obtained from transistors 76 and 80 with second emitter 120 of transistor 80 essentially acting as a differential pair with second emitter 122 of transistor 76.

As can be seen, the propagation delay for the true output is the delay through input transistor 74, reference transistor 76 and output transistor 80. The propagation delay for the complementary output is the delay through input transistor 74 and output transistor 84. Because transistor 76 always has a constant D.C. voltage applied to its base the Miller capacitance effect of turning on this transistor is minimal. Accordingly, the delay of the true and complementary outputs is equal to approximately the delay through transistors 74 and 80, and transistors 74 and 84, respectively. Comparing this to the prior art circuit shown in FIG. 2, the true output propagation delay is the delay through input transistor 32 and the minimal delay through reference transistor 38. The complementary output propagation delay, on the other hand, is the delay through transistor 32, the minimal delay through transistor 38 and the delay through transistor 42. The present invention thereby improves the difference between the true and complementary output propagation delays on the order of one transistor propagation delay.

As will be understood by those familiar with the art, the present invention may be embodied in other specific forms without departing from the spirit or essential characteristics thereof. For example, although less desirable, the circuit of FIG. 3 could be constructed without the clock and latching mechanism to provide a simple AND gate. Alternately, the present invention could be incorporated into sequential logic which would be compatible with combinational logic. For example the present invention could be incorporated into a master-slave flip-flop which is then coupled to the output of a multiplexer to produce a scan D flip-flop. Accordingly, the disclosure of the preferred embodiment of the invention is intended to be illustrative, but not limiting, of the scope of the invention which is set forth in the following claims.

What is claimed is:

1. A logic gate comprising:

a first input transistor having a base coupled to an input, a collector coupled to a voltage source and an emitter;

a second reference transistor having an emitter coupled to said emitter of said first transistor, a collector coupled to said voltage source and a base coupled to a voltage reference;

a third output transistor having a base coupled to said collector of said second transistor, a collector coupled to said voltage source and an emitter coupled to a true output;

a fourth complementary output transistor having a base coupled to a collector of said first transistor, a collector coupled to said voltage source and an emitter coupled to a complementary output;

fifth and sixth emitter-coupled transistors, a collector of said fifth transistor being coupled to said emitter of said first input transistor, a collector of said sixth transistor being coupled to a second emitter of said second reference transistor, a base of said fifth transistor being coupled to a clock input and a base of said sixth transistor being coupled to a second voltage reference;

said third true output transistor having a second emitter coupled to said collector of said sixth transistor;

seventh and eighth emitter-coupled transistors, said seventh transistor having a collector coupled to said voltage source and a base coupled to said clock input, said eighth transistor having a base coupled to said second voltage reference;

said fourth output transistor having a second emitter coupled to a collector of said eighth transistor; and a ninth reference transistor having a collector coupled to said base of said fourth complementary output transistor an emitter coupled to said collector of said eighth transistor and a base coupled to said voltage reference.

2. A logic gate comprising:

a first input transistor having a base coupled to an input, a collector coupled to a voltage source and an emitter;

a second reference transistor having an emitter coupled to said emitter of said first input transistor, a collector coupled to said voltage source and a base coupled to a voltage reference;

a third output transistor having a base coupled to said collector of said second reference transistor, a collector coupled to said voltage source and an emitter coupled to a true output;

a fourth output transistor having a base coupled to a collector of said first input transistor, a collector coupled to said voltage source and an emitter coupled to a complementary output; and a current source coupled to said emitters of said first, second, third and fourth transistors.

3. A logic gate comprising:

a first input transistor having a base coupled to an input, a collector coupled to a voltage source and an emitter;

a second reference transistor having an emitter coupled to said emitter of said first input transistor, a collector coupled to said voltage source and a base coupled to a voltage reference;

a third output transistor having a base coupled to said collector of said second reference transistor, a collector coupled to said voltage source and an emitter coupled to a true output;

a fourth output transistor having a base coupled to a collector of said first input transistor, a collector coupled to said voltage source and an emitter coupled to a complementary output; and means for latching said true and complementary outputs.

4. A logic gate comprising:

a first input transistor having a base coupled to an input, a collector coupled to a voltage source and an emitter;

a second reference transistor having an emitter coupled to said emitter of said first input transistor, a collector coupled to said voltage source and a base coupled to a first voltage reference;

a third output transistor having a base coupled to said collector of said second reference transistor, a collector coupled to said voltage source and an emitter coupled to a true output; and a fourth output transistor having a base coupled to a collector of said first input transistor, a collector coupled to said voltage source and an emitter coupled to a complementary output;

means for latching said true and complementary outputs;

said latching means comprises:

fifth and sixth emitter-coupled transistors, a collector of said fifth transistor being coupled to said emitter of said first input transistor, a collector of said sixth transistor being coupled to a second emitter of said second reference transistor, a base of said fifth emitter-coupled transistor being coupled to a clock input and a base of said sixth emitter-coupled transistor being coupled to a second voltage reference;

said third output transistor having a second emitter coupled to said collector of said sixth emitter-coupled transistor;

seventh and eighth emitter-coupled transistors, said seventh emitter-coupled transistor having a collector coupled to said voltage source and a base coupled to said clock input, said eight emitter-coupled transistor having a base coupled to said second voltage reference;

said fourth output transistor having a second emitter coupled to a collector of said eighth emitter-coupled transistor; and a ninth reference transistor having a collector coupled to said base of said fourth output transistor, an emitter coupled to said collector of said eighth emitter-coupled transistor and a base coupled to said first voltage reference.

* * * * *